United States Patent [19]
Schweighofer et al.

[11] Patent Number: 5,973,527
[45] Date of Patent: Oct. 26, 1999

[54] REGULATED INVERTER HAVING A SWITCHED OUTPUT STAGE AND DRIVER CIRCUIT THEREFOR

[75] Inventors: Peter Schweighofer, Nuremberg; Helmut Lenz, Oberasbach, both of Germany

[73] Assignee: Siemens Aktiengesellschaft, Munich, Germany

[21] Appl. No.: 09/037,242

[22] Filed: Mar. 9, 1998

[30] Foreign Application Priority Data

Mar. 10, 1997 [DE] Germany ............ 197 09 768

[51] Int. Cl.[6] ............ H03K 3/017; H03K 5/04
[52] U.S. Cl. ............ 327/172; 327/175; 363/26
[58] Field of Search ............ 327/108, 110, 327/171–172, 175; 363/17, 26; 330/10, 251, 207 A

[56] References Cited

U.S. PATENT DOCUMENTS 4,843,532 6/1989 Freedman ............ 363/26
5,515,258 5/1996 Viertler ............ 363/26

FOREIGN PATENT DOCUMENTS 5-276792 5/1993 Japan .

OTHER PUBLICATIONS

"Zuverlässiger Betrieb von MOSFETs in Brückenschaltungen," Hässig et al., Elektronik, vol. 10, Mar. 12, 1989, pp. 55–63.

Primary Examiner—Timothy P. Callahan
Assistant Examiner—An T. Luu
Attorney, Agent, or Firm—Hill & Simpson

[57] ABSTRACT

A drive arrangement for a switched output stage, such as an output stage of a gradient intensifier of a tomography apparatus has a pulse-width modulator and drive logic for producing at least two drive signals. The drive logic produces, for each drive signal, an edge of each on-phase pulse at a time made fixed corresponding to a time reference clock signal thereby allowing a fine adjustment of the on-phase of the power transistors of the switched output stage with low components costs, and a prescribed dead time between the individual on-phases is reliably adhered to.

9 Claims, 2 Drawing Sheets

REGULATED INVERTER HAVING A SWITCHED OUTPUT STAGE AND DRIVER CIRCUIT THEREFOR

BACKGROUND OF THE INVENTION

1. Field of the Invention

The present invention is directed to a regulated inverter of the type having a switched output stage, as well as to a driver circuit therefor.

2. Description of the Prior Art

A drive arrangement of the above type suited for all switch output stages of regulated inverse rectifiers (inverters) in half-bridge or full-bridge circuitry, especially for inverse rectifiers wherein high powers must be regulated with extreme exactitude. This is primarily the case with gradient amplifiers in nuclear magnetic resonance tomography devices, however, such a drive arrangement is also applicable to inductive heating means in X-ray devices or for drive control of electromotors.

In the example of utilization in a gradient amplifier, with current on the order of magnitude of 300 A an alternating voltage is created on the order of magnitude of ±300 V by means of a bridge circuit. The amplifier must have such a high precision that the current conduction in the mA-range is adjustable. Therefore, the on-phases of the individual switching elements in the bridge circuit basically must be continuously varied as to their respective durations. For this reason, driving circuits of gradient amplifiers heretofore have been purely analog in their structure and operation, because an arbitrarily fine control of the switching time of the switching transistor is thereby permitted. A digital, purely clock-driven circuit is not realistically realizable by today's means, because clock frequencies in the GHz-range would be necessary in order to obtain the required fine time resolution.

Furthermore it is necessary for the driving circuit to insert dead time between the on-phases of the power transistors in a bridge-arm to avoid what is known as a bridge short circuit. Such dead times have been created in known drive circuits by an asynchronous monostable flip-flop in connection with locking logic. Such a circuit is shown in FIG. 2a of the article "Reliable Operation of MOSFETs in Bridge Circuits" by Hans R. Hassig and Patrick Zoller in the journal Elektronik, Volume 10/12 May 1989, pages 55–63.

This simple circuit, however, is not suitable for the much more critical application of a gradient amplifier. There, an analog circuit with a high components cost must be used. Besides, a costly adjustment of the monostable flip-flop is required.

German OS 43 00 981 discloses a drive of the general type described initially. A microcontroller is designed as a pulse-width modulator and creates drive signals (pulse sequences) in cooperation with a drive logic, each of whose on-phases are separated by a dead time. Since the microcontroller is clock-driven, the leading as well as the trailing edges of the pulses of the drive signals are created at fixed times.

The drive arrangement of German OS 43 00 981 disclosed for use for driving an inverse rectifier for a motor or transducer. This known circuit, however, is not suitable for very high-precision demands such as exist in gradient amplifiers. As already discussed, the clock frequency of the microcontroller would have to be in the GHz-range in order to achieve the necessary time resolution.

Likewise, a drive logic circuit is known from Japanese Application 5-276 792 which creates the leading as well as the trailing edges of drive signals at fixed times.

SUMMARY OF THE INVENTION

An object of the present invention is to provide a drive arrangement for a switched output stage, especially of a gradient amplifier, which allows an especially fine adjustment of the on-phase of the power transistors as well as of the dead time between the on-phases.

The above object is achieved in accordance with the principles of the present invention in a regulated inverter having a switched output stage, and in a driver circuit therefor wherein a pulse-width modulator is employed for generating a pulse-width modulated signal which is supplied to drive logic which produces at least two drive signals, each drive signal having on-phases separated by a dead time. The drive signals are supplied to the switched output stage. The drive logic, in producing the drive signals, causes an edge of each on-phase to be produced at a preset or fixed time relative to a time reference clock, and the other edge of each on-phase is produced by the drive logic at a continuously variable time, dependent on the pulse-width modulated signal.

The invention proceeds on the basis of chronologically fixing or presetting, for each signal (pulse sequence), only one of the edges of the respective pulses. These switch edges can be delayed until the expiration of a preset dead time by means of a digital, clock-controlled circuit. Such a switch provided in the drive logic is relatively simple. It can be constructed with customary, highly integrated components, thus requiring little room on a mother board. An adjustment of the digital circuit is not necessary.

Either the leading or the trailing edge of each drive signal pulse is made fixed by the inventive drive arrangement. The other edge of each pulse is inventively continuously variable depending on the drive signal. It is thereby achieved that the duration of each on-phase of the driven power transistor is adjustable in an arbitrarily fine manner, as in a purely analog circuit. For the continually variable edge of each on-phase an edge of the pulse-width modulation signal can be transferred to the drive signal. The dead times are preferably generated in the drive arrangement by a timer triggered by a time reference clock or a clock of another type, this timer beginning to count (time) at a predetermined count at the end of a preceding on-phase. An adjustment of the circuit is thus unnecessary. The edge of each on-phase, which is made chronologically fixed, is preferably created exactly with that edge of the time reference clock in which the count reaches a preset value.

A time offset results between the prescribed and the actual switching time because an edge of each drive signal is preset (made fixed). This offset is balanced (compensated) by a controlled inverse rectifier. It is desirable, however, to keep the average chronological offset (=error) small over a number of switching cycles, so that the controller must compensate as little as possible.

In a preferred embodiment this error is decreased by employing a time reference clock operating at a frequency having a non-integral relationship to the frequency of the pulse-width modulation signal fed into the drive arrangement. In another embodiment the time reference clock is periodically inverted for the same reason, so that the leading, or the trailing, edges of the time-grid of the clock signal alternatingly serve to determine the edges of the drive which are preset.

The inventive drive arrangement can be a component of a controlled inverse rectifier serving as a gradient amplifier in a nuclear magnetic resonance tomography apparatus. The time reference clock is then preferably synchronized with a system clock of the tomography device, repeating every few cycles. Thus, low-frequency oscillations which could appear on the image of the tomography apparatus are prevented.

DESCRIPTION OF THE PREFERRED EMBODIMENTS

Figure 1:
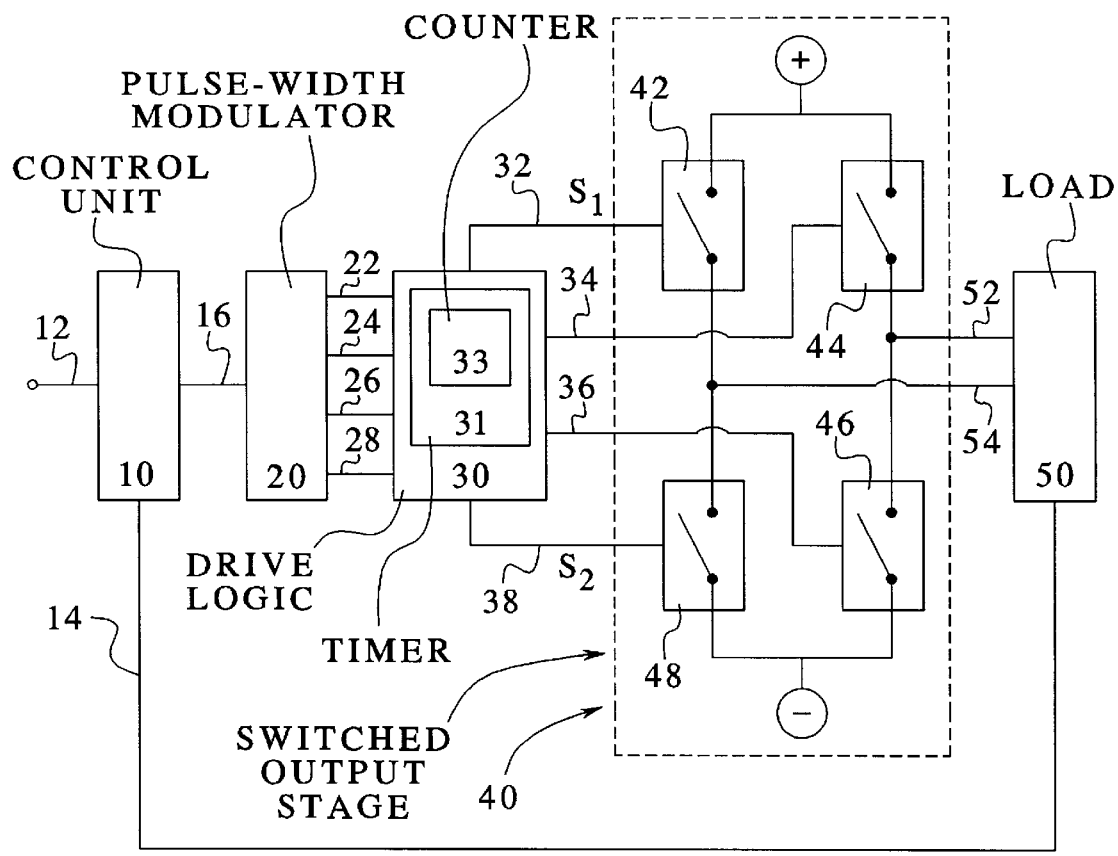
FIG. 1 is a block diagram of a gradient amplifier of a nuclear magnetic resonance tomography apparatus with an inventive drive arrangement.

The gradient amplifier depicted in FIG. 1 includes a control unit 10 which has an input 12 to receive a command variable (target value), and a line 14 for receiving a control variable (actual value) from a load 50. The control unit 10 produces a manipulated quantity in a known way using a comparator and a controller, this manipulated quantity being fed into a pulse-width modulator 20 via a line 16.

The pulse-width modulator 20 is likewise of a known type. From the manipulated variable in the exemplifying embodiment described herein, the pulse-width modulator 20 generates four pulse-width signals which are conveyed respectively via lines 22, 24, 26 and 28 to the drive logic 30. Each pulse-width signal is created in the pulse-width modulator 20 by a comparison of the manipulated variable with a delta signal. The delta signal originates in an oscillator of the pulse-width modulator 20 and has a fixed or variable frequency prescribed by a switching clock, on the order of magnitude of 50 kHz.

The drive logic 30 is embodied employing digital circuitry, and contains a generator which produces, or has access to, a time reference clock signal on the order of magnitude of 32 MHZ. For each of the four pulse-width signals the drive logic 30 contains a timer 31, a driver and other components in order to create a drive signal from each of the pulse-width signals. Lines 32, 34, 36 and 38 serve to convey the four drive signals to a switched output stage 40.

The switched output stage 40 contains four switch elements 42, 44, 46 and 48 arranged in bridge circuitry (H-bridges) and which reacts to each drive signal of the drive logic 30. The switch elements 42, 44, 46 and 48, for example, are configured as MOSFET transistors or as bipolar transistors with recovery diodes. The switch elements are connected two at a time (42 and 44, or 46 and 48 respectively) with the negative or the positive terminal of a supply (i.e., main distribution) voltage. The remaining terminals from each of the two switching elements (42 and 48, or 44 and 46) arranged in a bridge-arm are connected in a pair with each other and with each of the connection lines 52 and 54.

A primarily inductive load 50, for example a gradient coil, is connected to the connection lines 52 and 54. A voltage proportional to the current flowing through the gradient coil is tapped at a shunt resistance of the load 50 and is conveyed as control variable to the control unit 10 directly via the line 14, or via a suitable measuring transducer.

Figure 2:
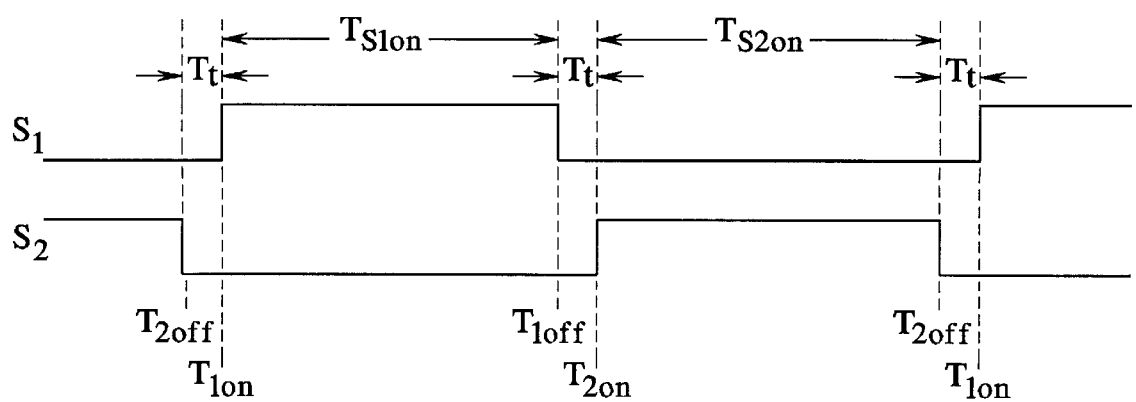
FIG. 2 is a timing diagram of two drive signals produced in the inventive apparatus.

FIG. 2 depicts two of the four drive signals more closely, namely, S1, the signal conveyed via the line 32 which serves to drive the switch element 42, and S2, the signal conveyed via the line 38 to the switch element 48. Both switching elements 42 and 48 are arranged in a bridge-arm and are connected with opposite poles of the distribution voltage, so that they cannot be switched on simultaneously, so as to avoid a bridge short circuit.

As can be seen from FIG. 2, the on-phase $T_{S1on}$ of the signal $S_1$ is limited by the times $T_{1on}$ and $T_{1off}$. Correspondingly, the times $T_{2on}$ and $T_{2off}$ limit the on-phase $T_{S2on}$ of the signal $S_2$. The respective on-phases $T_{S1on}$ and $T_{S2on}$ are separated by a dead time $T_t$, in which the previously-conducting switch element 42 (or 48) can revert to an off-state. In the exemplary embodiment described herein, the dead time $T_t$ amounts to about 400 ns.

Figure 3:
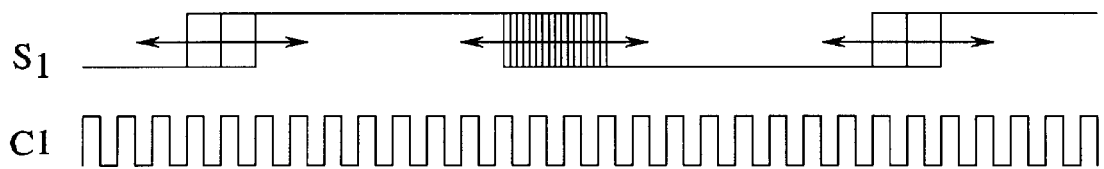
FIG. 3 is a timing diagram of a drive signal and a time reference clock signal.

In the example of the signal $S_1$ in FIG. 3 it can be seen that the leading edge of the drive signal $S_1$ is made fixed (i.e., it occurs at a preset relative time) by the drive logic 30 corresponding to a prescribed discrete time raster (here the leading edges of the time reference clock signal $C_1$). The time $T_{S1on}$ thus always coincides with a leading edge of a pulse of the clock signal $C_1$. In contrast thereto, the trailing edge of the drive signal $S_1$ (time $T_{S1off}$) is not fixed, but is instead continuously variable.

More exactly, in the exemplary embodiment described herein the drive logic 30 produces the trailing edges of $S_1$ in immediate reaction to a trailing edge of the corresponding pulse-width signal without a chronological delay. The leading edge of $S_1$ is produced in reaction to the first leading edge of the time reference clock signal $C_1$, which occurs as soon as the allocated pulse-width signal arrives and the dead time $T_t$ has expired.

To determine the dead time $T_t$ the timer 31 provided in the drive logic 30 for the drive signal $S_1$ contains a counter 33 which is set at a predetermined value (count) as soon as the previous on-phase of $S_2$ is finished (i.e. at time $T_{S2off}$). This value is 13 for a time reference clock frequency of 32 MHZ and a desired dead time of at least 400 ns, for example. The counter 33 is triggered by the time reference clock signal C1, so that the count decreases by 1 with each leading edge of C1. As soon as the count reaches the value 0, the on-phase of $S_1$ can be started with the corresponding value of the pulse-width signal.

The other drive signals are produced likewise.

Figure 4:
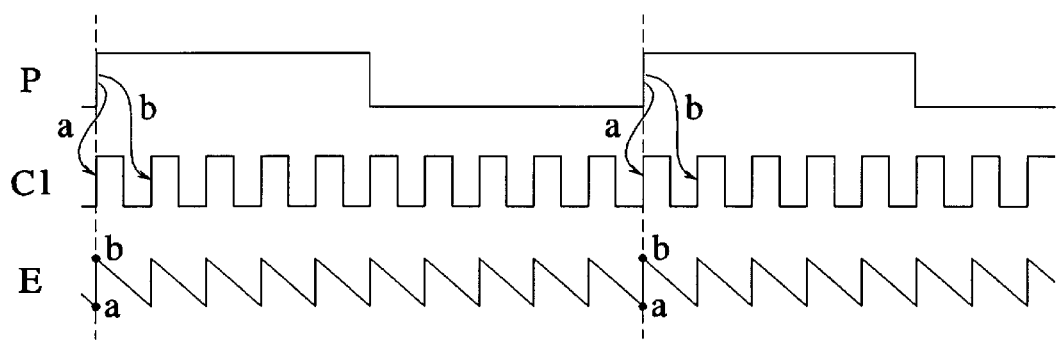
FIGS. 4 and 5 respective are timing diagrams of a pulse-width signal and a clock signal in even-numbered and odd-numbered correspondence.
Figure 5:
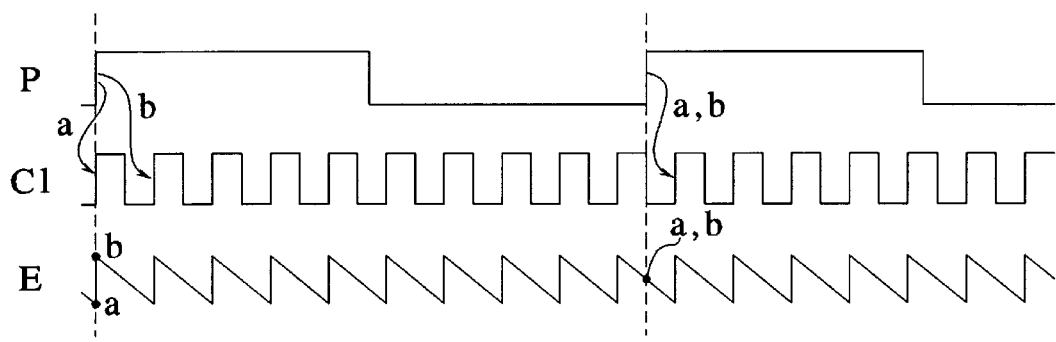
Figure 6:
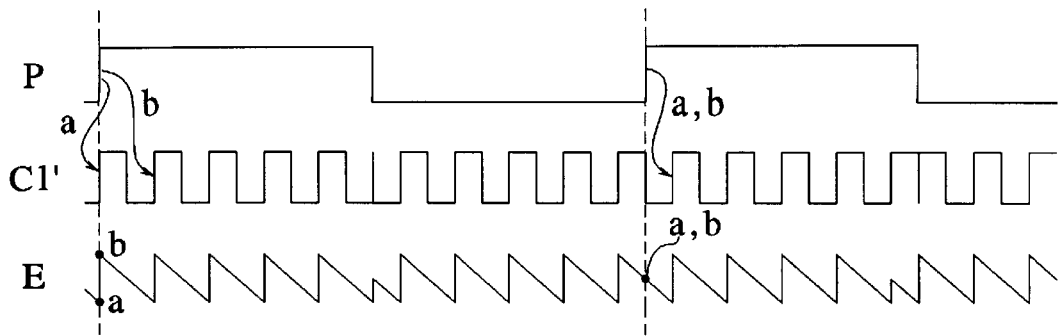
FIG. 6 shows a time reference clock signal and an error value in an alternative embodiment of the invention.

A chronological offset up to a maximum of one period of the time reference clock signal C1 relative to the target on-phase time prescribed by the pulse-width signal results when the on-phase time $T_{S1on}$, or $T_{S2on}$, is made fixed. This is depicted in FIGS. 4–6. The time reference clock signal C1 and a pulse-width signal designated P which has not been made fixed are shown therein. The curve E indicates the time delay for each target on-phase time of the signal P, this delay resulting when this on-phase time is made fixed in an emitted drive signal (not depicted in FIGS. 4–6).

In FIG. 4 the time reference clock signal C1 has ten times the frequency of the pulse-width signal P. Two cases a) and b) are depicted. In a) each leading switch-edge of the pulse-width signal P arrives shortly before a leading edge of the time reference clock signal C1, so that the on-phase time in the resulting drive signal agrees with this leading edge of C1. The chronological offset practically equals 0, as is indicated by the curve E at the points a). In b) the switch-edges of the pulse-width signal P occur shortly after a leading edge of the time reference clock signal C1. The $T_{S1on}$ time of the drive signal is delayed by the inventive presetting until the next leading edge of C1, or almost an entire period of the time reference clock C1.

This chronological offset or error of the on-time in b) is in principle balanced by the control means 10. It is, however, desirable to keep the offset as low as possible, so that the characteristic of the uncontrolled amplifier proceeds optimally finely stepped, and the control unit 10 must correct as little as possible. Problems can arise especially if the offset between a) and b), i.e. with a low time delay of the signal P, changes discontinuously.

Increasing the frequency of the time reference clock signal C1 would in fact lower the maximal error correspondingly, but this is possible only to a limited extent. The embodiment depicted in FIG. 5 shows a way to lower the average error over a number of switching cycles without increasing clock frequency. To this end, a non-integral relationship between the time reference clock signal C1 and the switching clock of the pulse-width signal P is selected; a ratio of 9.5:1 in the present case. The error agrees with that of FIG. 4 for the first leading edge of the pulse-width signal P; for the second leading edge it amounts to only 0.5 times the period of the time reference clock C1 in a) and b) respectively.

Thus, the total error over two clock cycles of the signal P amounts to 0.5 times the period of the time reference clock in a) and 1.5 times the period in b). This is not only absolute but also is advantageous with respect to the oscillation width as compared to the embodiment depicted in FIG. 4, in which the total error lies between 0 and 2 times the period of the time reference clock.

The same result as with the odd-numbered clock relationship depicted in FIG. 5 can also be obtained if the time reference clock C1 is inverted in every other period of the switching clock employed for producing the pulse-width signal P. FIG. 6 depicts this embodiment, the periodically inverted time reference clock being designated C1'. In the result, the edge of the drive signal which is made fixed coincides alternatingly with the leading and the trailing edges of the time reference clock C1'. Again, the total error over two clock cycles of the signal P amounts to between 0.5 and 1.5 times the period of the time reference clock C1'.

The hardware and adjustment costs for the drive arrangement are clearly reduced by the invention. In the known, purely analog seventy-five MSI chips (integrated switching circuits with average integration density) were required and twelve potentiometers had to be adjusted. In contrast thereto, the circuitry constructed according to the inventive principle requires only three LSI chips (integrated switching circuits with high integration density) and three driving modules. No adjustment is necessary.

Although modifications and changes may be suggested by those skilled in the art, it is the intention of the inventors to embody within the patent warranted hereon all changes and modifications as reasonably and properly come within the scope of their contribution to the art.

We claim as our invention:

1. A driver circuit for a regulated inverter having a switched output stage, said driver circuit comprising:

a pulse width modulator which generates a pulse-width modulated signal; and drive logic means supplied with said pulse-width modulated signal for producing two drive signals from said pulse-width modulated signal for supply to said switched output stage, each drive signal having on-phases having edges and being separated by a dead time, said drive logic means producing one of said edges of each on-phase in each drive signal at a preset time relative to a time reference clock signal, and producing another of said edges of each on-phase of each drive signal at a continuously variable time dependent on said pulse-width signal.

2. A driver circuit as claimed in claim 1 wherein said drive logic means comprises means for producing said another of said edges at a continuously variable time chronologically coinciding with each edge of said pulse-width modulated signal.

3. A driver circuit as claimed in claim 1 wherein said drive logic means comprises means for producing said one of said edges and said another of said edges of each on-phase of each drive signal at a time chronologically coinciding with each edge of said time reference clock signal.

4. A driver circuit as claimed in claim 1 wherein said drive logic means comprises timer means for determining said dead time, said timer means counting a predetermined number of edges of said time reference clock signal starting from an ending time of a preceding on-phase.

5. A driver circuit as claimed in claim 1 wherein said drive logic means comprises timer means for determining said dead time, said timer means counting a predetermined number of cycles of said time reference clock signal starting from an ending time of a preceding on-phase.

6. A driver circuit as claimed in claim 1 wherein said time reference clock signal has a frequency and wherein said pulse-width modulated signal has a frequency, and wherein said frequency of said time-reference clock signal has a non-integral relationship to said frequency of said pulse-width modulated signal.

7. A driver circuit as claimed in claim 1 wherein said time reference clock includes a plurality of pulses each having a leading edge and a trailing edge, and wherein said drive logic means determines each edge of each on-phase of said drive signals periodically alternatingly coinciding with said leading and trailing edges of said time reference clock signal.

8. A driver circuit as claimed in claim 7 further comprising inverter means for periodically inverting said time reference clock signal.

9. A regulated inverter comprising:

a switched output stage;

a pulse width modulator which generates a pulse-width modulated signal;

drive logic means supplied with said pulse-width modulated signal for producing two drive signals from said pulse-width modulated signal for supply to said switched output stage, each drive signal having on-phases having edges and being separated by a dead time, said drive logic means producing one of said edges of each on-phase in each drive signal at a preset time relative to a time reference clock signal, and producing another of said edges of each on-phase of each drive signal at a continuously variable time dependent on said pulse-width signal; and control means for supplying an input signal to said pulse-width modulator dependent on a characteristic of a load connected to said output stage.

* * * * *